United States Patent
You et al.

(10) Patent No.: US 7,956,659 B2
(45) Date of Patent: Jun. 7, 2011

(54) SEMICONDUCTOR MEMORY DEVICE CAPABLE OF EASILY PERFORMING DELAY LOCKING OPERATION UNDER HIGH FREQUENCY SYSTEM CLOCK

(75) Inventors: Min-Young You, Kyoungki-do (KR); Seong-Jun Lee, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 58 days.

(21) Appl. No.: 11/647,645

(22) Filed: Dec. 29, 2006

(65) Prior Publication Data

US 2008/0136479 A1    Jun. 12, 2008

(30) Foreign Application Priority Data

Sep. 29, 2006  (KR) ................. 10-2006-0096481

(51) Int. Cl.
    *H03L 7/00*        (2006.01)
(52) U.S. Cl. .................. 327/161; 327/162; 327/158
(58) Field of Classification Search .............. 327/161, 327/162, 158, 172, 175, 52–56
    See application file for complete search history.

(56) References Cited

U.S. PATENT DOCUMENTS

| | | | |
|---|---|---|---|
| 6,225,834 B1 * | 5/2001 | Gang | 327/55 |
| 6,377,511 B1 * | 4/2002 | Okuda et al. | 365/233.11 |
| 6,452,432 B2 * | 9/2002 | Kim | 327/158 |
| 6,466,071 B2 * | 10/2002 | Kim et al. | 327/175 |
| 6,768,348 B2 * | 7/2004 | Shionoiri et al. | 327/51 |
| 7,199,634 B2 * | 4/2007 | Cho et al. | 327/175 |
| 7,298,180 B2 * | 11/2007 | Hung | 327/57 |

FOREIGN PATENT DOCUMENTS

| | | |
|---|---|---|
| KR | 10-2004-0090180 | 10/2004 |
| KR | 10-2005-0040551 | 5/2005 |
| KR | 10-2005-0055925 | 6/2005 |
| KR | 10-2005-0079801 | 8/2005 |

* cited by examiner

*Primary Examiner* — Lincoln Donovan
*Assistant Examiner* — Diana J Cheng
(74) *Attorney, Agent, or Firm* — Blakely, Sokoloff, Taylor & Zafman LLP

(57) ABSTRACT

A semiconductor memory device includes a first clock buffer for outputting a first internal clock signal in response to an inverted signal of the system clock signal and for correcting a duty cycle ratio of the first internal clock signal in response to a control signal; a second clock buffer for outputting a second internal clock signal in response to the system clock signal and for correcting a duty cycle ratio of the second internal clock signal in response to the control signal; an analog duty cycle correction circuit for outputting the control signal corresponding to the duty cycle ratio of the first and second internal clock signals; a mixing circuit for mixing the first and second internal clock signals and for outputting a third internal clock signal whose duty cycle is corrected; and a DLL circuit for outputting a delay-locked clock signal by using the third internal clock signal.

10 Claims, 4 Drawing Sheets

SEMICONDUCTOR MEMORY DEVICE CAPABLE OF EASILY PERFORMING DELAY LOCKING OPERATION UNDER HIGH FREQUENCY SYSTEM CLOCK

CROSS-REFERENCE TO RELATED APPLICATIONS

The present invention claims priority of Korean patent application no. 10-2006-0096481, filed in the Korean Patent Office on Sep. 29, 2006, which is incorporated by reference in its entirety.

BACKGROUND OF THE INVENTION

The present invention relates to a semiconductor memory device; and, more particularly, to a delay locked loop of the semiconductor memory device.

In a system consisting of a plurality of semiconductor devices, a semiconductor memory device is used as an apparatus to store data. When data are required in a data processing unit, for example, the central processing unit (CPU) etc., the semiconductor memory device outputs data corresponding to an address signal which is inputted from an apparatus to demand the data, or stores the data in a location corresponding to the address signal provided from an apparatus.

As the working speed of the system consisting of semiconductor devices becomes faster and the semiconductor device is highly integrated, semiconductor memory devices are also required to read or store the data faster. In order to input/output the data at a high speed, a synchronous memory device, which receives a system clock signal and inputs/outputs the data in synchronization with the system clock signal, has been developed. However, since the synchronous memory device is not sufficient to satisfy the required data input/output speed, a DDR (Double Data Rate) synchronous memory device, in which the data are inputted or outputted in synchronization with both a falling edge and a rising edge of the system clock signal, has been developed.

Since the DDR synchronous memory device inputs/outputs the data at the falling edge and the rising edge of the system clock signal, it processes the two data during one period of the system clock signal. That is, the DDR synchronous memory device has to output the data at the falling edge or the rising edge of the system clock signal and it has to store the input data at the falling edge or the rising edge of the system clock signal. Particularly, the timing when the DDR memory device outputs the data is to be accurately synchronized with the falling or rising edge of the system clock signal. Accordingly, a data output circuit of the DDR memory device also outputs the data in synchronization with the falling edge or the rising edge of the system clock signal inputted to the memory device.

However, the system clock signal inputted to the memory device reaches the data output circuit with a delay time which is inevitably caused by a clock input buffer and a signal transmission line in the memory device. Therefore, when the data output circuit outputs the data in synchronization with the delayed system clock signal, an external circuit which receives the data from the semiconductor memory device can receive the undesired data which are not exactly synchronized with the falling edge and the rising edge of the system clock signal.

In order to solve the problem, the semiconductor memory device includes a DLL (delay locked loop) circuit to fix the delay of the clock signal. The DLL circuit is an apparatus for compensating for an amount of the delay in an internal circuit of the memory device since the system clock signal is inputted to the memory device until it is delivered to the data output circuit. The DLL circuit seeks out a delay time of the system clock signal which is caused by the clock input buffer and the signal transmission line in the semiconductor memory device and outputs the system clock signal delayed according to an amount of the measured delay time to the data output circuit. That is, using the DLL circuit, the system clock signal inputted to the memory device is transferred to the data output circuit in a state where the delay of the system clock signal is fixed. The data output circuit outputs the data in synchronization with a delay-locked clock signal and the external circuit recognizes the delayed output data from the DDR memory as an exact output data which is synchronized with the system clock signal.

In actual operation, a delay-locked clock signal, which is outputted from a DLL circuit before one period of the clock signal at the time of outputting the data, is delivered to an output buffer and the data are outputted in synchronization with the delivered delay-locked clock signal. Accordingly, the data are more rapidly outputted than the delay time of the system clock signal which is delayed by the internal circuit of the memory device. In view of the external circuit of the memory device, the data output is accurately synchronized with the rising edge and the falling edge of the system clock signal inputted to the memory device. In conclusion, the DLL circuit is an apparatus to find out a value to determine how fast the data are outputted in order to compensate for the delay of the system clock signal in the memory device.

FIG. 1 is a block diagram of a conventional semiconductor memory device. The conventional semiconductor memory device includes a clock buffer 11, a clock driver 15, a first replica model 16A, a second replica model 16B, a first DLL circuit 18A, a second DLL circuit 18B, a duty cycle correction circuit 20, a rising clock driver 21A and a falling clock driver 21B. The clock buffer 11 receiving and buffering external system clock signals CLK and CLKB outputs a rising clock signal RCLK. The clock driver 15 receives the rising clock signal RCLK and outputs a reference clock signal REFCLK. The first DLL circuit 18A receiving the reference clock signal RECLKR and a rising feedback clock signal FBCLKR outputs a clock signal which is produced by delaying the reference clock signal REFCLK for a predetermined time. The second DLL circuit 18B receiving the reference clock signal REFCLK and a falling feedback clock signal FBCLKF outputs a clock signal which is produced by delaying the reference clock signal REFCLK for a predetermined time. The duty cycle correction circuit 20 controls the duty cycle ratio of the output signals from the first DLL circuit 18A and the second DLL circuit 18B.

The first replica model 16A delays a clock signal FBCLK_PR outputted from the duty cycle correction circuit 20 by a modeling value and outputs the rising feedback clock signal FBCLKR. The second replica model 16B delays a clock signal FBCLK_PF outputted from the duty cycle correction circuit 20 by the modeling value and outputs the falling feedback clock signal FBCLKR. The rising clock driver 21A receives the clock signal FBCLK_PR outputted from the duty cycle correction circuit 20 and outputs a delay-locked rising clock signal RCLK_DLL whose delay is fixed. The falling clock driver 21B also receives the clock signal FBCLK_PF outputted from the duty cycle correction circuit 20 and outputs a delay-locked falling clock signal FCLK_DLL whose delay is fixed.

The first DLL circuit 18A outputs a clock signal, which is produced by delaying the reference clock signal REFCLK with a delayed clock signal of the reference clock signal REFCLK, to the duty cycle correction circuit 20. The second DLL circuit 18B outputs a clock signal, which is produced by delaying the reference clock signal REFCLK with a delayed clock signal of an inverted reference clock signal, to the duty cycle correction circuit 20. The reason why these two DLL circuits are employed is that it is necessary to match the duty cycle ratio of the delay-locked clock signals. The first DLL circuit 18A performs the delay locking operation based on the rising edge of the reference clock REFCLK. The second DLL circuit 18b performs the delay locking operation based on the falling edge of the reference clock REFCLK. As mentioned above, the delay locking operations are performed respectively and the duty cycle correction circuit 20 outputs a duty cycle corrected clock signal by mixing two clock signals outputted from the first and second DLL circuits 18A and 18B. Accordingly, as compared with the first DLL circuit 18A, the second DLL circuit 18B performs the locking operation with a time difference of a half (½) clock.

On the other hand, as the operating speed of the semiconductor memory device increases, the frequency of the system clock signal inputted to the memory device becomes higher. The time margin for the operation of the semiconductor memory device is decreased and the margin about the operation for making the clock signal whose delay is fixed is also more and more decreased. Particularly, since the second DLL circuit 18B operates with the time difference of the half clock being different from the first DLL circuit 18A, it is very difficult to perform an exact delay locking operation.

SUMMARY OF THE INVENTION

Embodiments of the present invention are directed to provide a delay locked loop of a semiconductor memory device.

In accordance with an aspect of the present invention, there is provided a semiconductor memory device comprising: a first clock buffer for outputting a first internal clock signal by buffering a system clock signal in response to an inverted signal of the system clock signal and for correcting a duty cycle ratio of the first internal clock signal in response to a control signal; a second clock buffer for outputting a second internal clock signal by buffering the inverted signal of the system clock signal in response to the system clock signal and for correcting a duty cycle ratio of the second internal clock signal in response to the control signal; an analog duty cycle correction circuit for outputting the control signal corresponding to the duty cycle ratio of the first and second internal clock signals; a mixing circuit for mixing the first and second internal clock signals and for outputting a third internal clock signal whose duty cycle is corrected; and a DLL circuit for outputting a delay-locked clock signal by using the third internal clock signal.

In accordance with another aspect of the present invention, there is provided a semiconductor memory device comprising: a first clock buffer for outputting a first internal clock signal by buffering a system clock signal in response to an inverted signal of the system clock signal and for correcting a duty cycle ratio of the first internal clock signal in response to a control signal; a second clock buffer for outputting a second internal clock signal by buffering the inverted signal of the system clock signal in response to the system clock signal and for correcting a duty cycle ratio of the second internal clock signal in response to the control signal; an analog duty cycle correction circuit for outputting the control signal corresponding to the duty cycle ratio of the first and second internal clock signals; a mixing circuit for mixing the first and second internal clock signals and for outputting a third internal clock signal whose duty cycle is corrected; a first DLL circuit for performing a delay locking operation based on a rising edge of the third internal clock and a first divided clock signal; a detecting unit for activating and outputting a detecting signal when a section between the rising and a falling edges of the third internal clock signal is smaller than a stored value; a first dividing circuit for outputting the first divided clock signal to the first DLL circuit in response to the detecting signal, wherein the first divided clock signal is produced by dividing an output of the first DLL circuit; a second DLL circuit for performing a delay locking operation based on the falling edge of the third internal clock signal and a second divided clock signal; and a second dividing circuit for outputting the second divided clock signal to the second DLL circuit in response to the detecting signal, wherein the second divided clock signal is produced by dividing an output of the second DLL circuit.

In accordance with another aspect of the present invention, there is provided a method for driving a semiconductor memory device comprising the steps of: outputting a first internal clock signal by buffering a system clock signal in response to an inverted system clock signal, wherein the first internal clock signal is outputted with a duty cycle correction in response to a control signal; outputting a second internal clock signal by buffering the inverted system clock signal in response to the system clock signal, wherein the second internal clock signal is outputted with a duty cycle correction in response to the control signal; outputting the control signal corresponding to a duty cycle ratio of the first and second internal clock signals; mixing the first and second internal clock signals for outputting a duty cycle-corrected third internal clock signal; and outputting a delay-looked clock signal by using the third internal clock signal.

DESCRIPTION OF SPECIFIC EMBODIMENTS

An object of the present invention is to provide a semiconductor memory device capable of easily performing a delay locking operation under a high frequency of system clock signal.

The semiconductor memory device according to the preferred embodiment of the present invention is characterized in that: first, an input unit to which the system clock signal is inputted performs the duty cycle correction and a DLL circuit receives the duty cycle corrected clock signal; second, the delay locking operation is performed after dividing the duty cycle corrected reference signal when the frequency of it is higher than a predetermined value; third, an output of the DLL circuit is directly used to make a feedback clock signal without the process of the duty cycle correction. The semiconductor memory device according to the present invention, with the above-described characteristics, can easily perform the delay locking operation using the system clock signal. The semiconductor memory device according to the present invention can produce a delay-locked clock signal more stably. If the delay-locked clock signal is stably generated, the semiconductor memory device outputs the data at the reliable timing so that this stable operation further improves the reliability of the system operation.

Now the preferred embodiments according to the present invention will be described with reference to the accompanying drawings. Since preferred embodiments are provided for the purpose that the ordinary skilled person in the art is able to understand the present invention, they may be modified in various manners and the scope of the present invention is not limited by the preferred embodiments described later.

Figure 1:
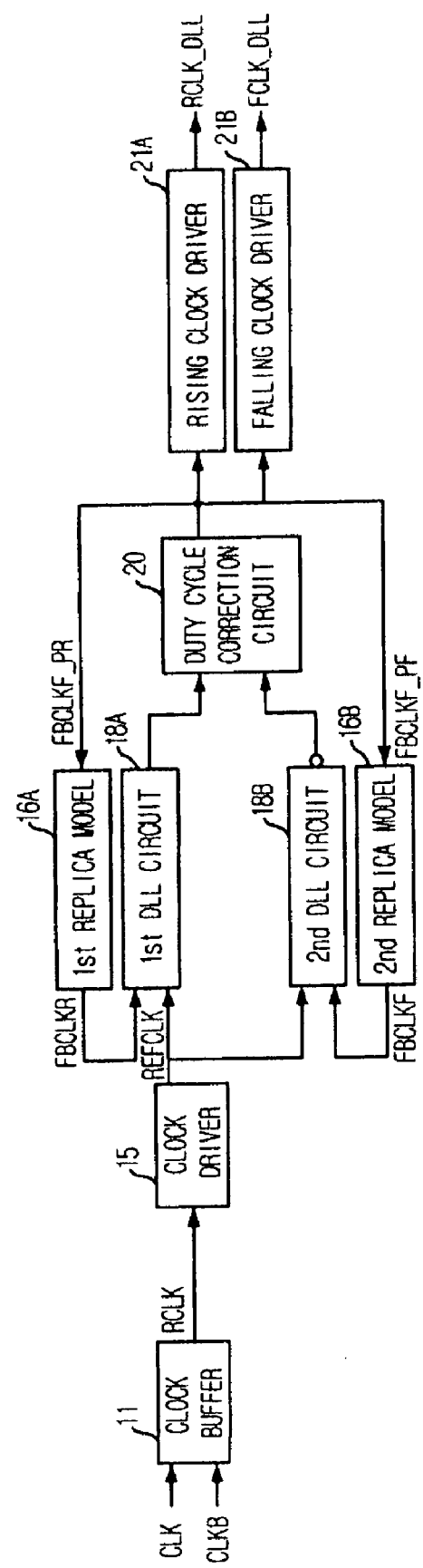
FIG. 1 is a block diagram of a conventional semiconductor memory device.
Figure 2:
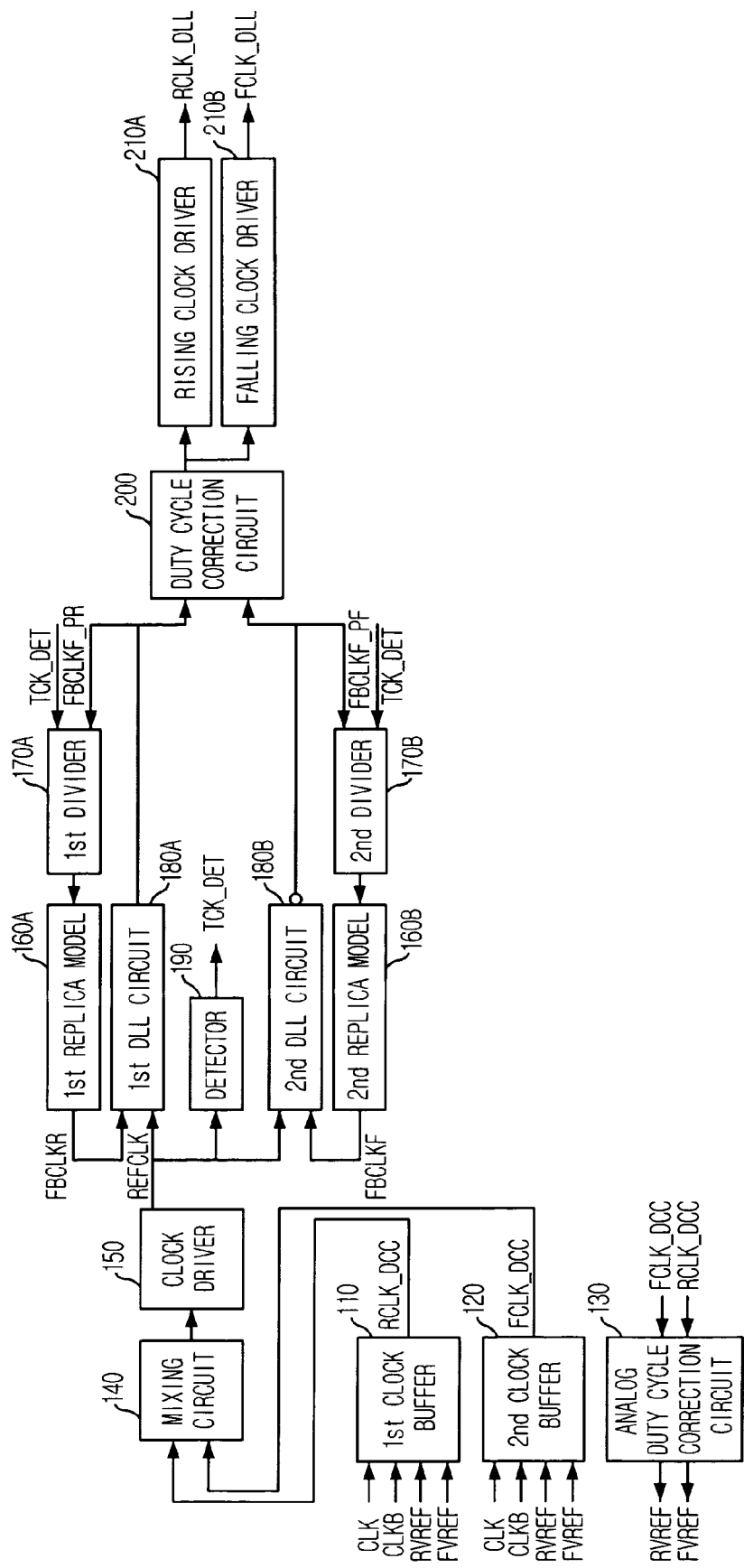
FIG. 2 is a block diagram of a semiconductor memory device according to the preferred embodiment of the present invention.

FIG. 2 is a block diagram of a semiconductor memory device according to the preferred embodiment of the present invention. The semiconductor memory device according to the present invention includes a first clock buffer 110, a second clock buffer 120, an analog duty cycle correction circuit 130, a mixing circuit 140, a clock driver 150, a first replica model 160A, a second replica model 160B, a first divider 170A, a second divider 170B, a first DLL circuit 180A, a second DLL circuit 180B, a detector 190, a duty cycle correction circuit 200, a rising clock driver 210A and a falling clock driver 210B.

The first clock buffer 110 outputs a first internal clock signal RCLK_DCC by buffering a system clock signal CLK based on an inverted system clock signal CLKB and the duty cycle ratio of the first internal clock signal RCLK_DCC is amended in the first clock buffer 110 in response to first and second control signals RVREF and FVREF. The second clock buffer 120 outputs a second internal clock signal FCLK_DCC by buffering the inverted system clock signal CLKB based on the system clock signal CLK and the duty cycle ratio of the second internal clock signal FCLK_DCC is also amended in the second clock buffer 120 in response to the first and second control signals RVREF and FVREF. The analog duty cycle correction circuit 130 outputs the first and second control signals RVREF and FVREF corresponding to the duty cycle ratio of the first internal clock signal RCLK_DCC and the second internal clock signal FCLK_DCC. The mixing circuit 140 outputs a third internal clock signal ML, which is duty cycle-corrected, by mixing the first internal clock signal RCLK_DCC and the second internal clock signal FCLK_DCC. The clock driver 150 to receive the third internal clock signal ML outputs a reference clock signal REFCLK.

Therefore, one feature of the semiconductor memory device according to the preferred embodiment of the present invention to perform the delay locking operation is that the duty cycle ratio of the inputted system clock signal is first corrected and the duty cycle-corrected clock signal is delivered to the DLL circuit. The delay locking operations in the first and second DLL circuits 180A and 180B are easily carried out by using the duty cycle-corrected reference clock signal REFCLK. Particularly, as compared with the first DLL circuit 180A, the second DLL circuit 180B has a time lag of a half clock. When the duty cycle ratio of the reference clock signal is exactly matched and inputted into the second DLL circuit 180B, the second DLL circuit 180B can carry out the delay locking operation more effectively.

Further, the detector 190 activates and outputs a detecting signal TCK_DET when a logic high section or a logic low section of the reference clock signal REFCLK is smaller than a stored value. The first and second dividers 170A and 170B respectively divide output signals of the first and second DLL circuits 180A and 180B in response to the detecting signal TCK_DET or deliver them without the division. The first replica model 170a and the second replica model 170b output rising and falling feedback clock signals FBCLKR and FBCLKF, which are produced by delaying the output signals of the first and second dividers 170A and 170B by a modeling value, to the first and second DLL circuits 180A and 180B, respectively.

Because each of the first and second dividers 170A and 170B carries out a division operation when the frequency of the reference clock signal REFCLK is over a predetermined value, the frequency of the rising and falling feedback clock signals FBCLKR and FBCLKF is decreased. Therefore, even though the system clock signal is inputted at high frequency, the delay locking operations of the first and second DLL circuits 180A and 180B can be smoothly progressed.

Each of the first DLL circuit 180A and the second DLL circuit 180B includes a delay line, a delay line controller and a phase comparator which are required to perform a general delay locking operation. The first DLL circuit 180A compares the phase of the rising feedback clock signal FBCLKR with the phase of the reference clock signal REFCLK using circuit elements included therein and outputs a clock signal which is produced by locking the delay value of the reference clock signal REFCLK. The operation of the second DLL circuit 180B is similar to that of the first DLL circuit 180A; however, the delay locking operation in the second DLL circuit 180B is carried out after inverting the reference clock signal REFCLK. That is, the first DLL circuit 180A performs the delay locking operation by using the rising edge of the reference clock signal REFCLK and the second DLL circuit 180B performs the delay locking operation by using the falling edge of the reference clock.

The duty cycle correction circuit 200 receives output signals of the first and second DLL circuits 180A and 180B and then outputs a clock signal with the duty cycle correction. Even though the duty cycle of the reference clock signal REFCLK has been already corrected, the duty cycle correction is carried out once more to adjust the duty value which can be mismatched during the delay locking operation. The rising clock driver 210A outputs a clock signal, which is inputted from the duty cycle correction circuit 200, as the rising clock signal RCLK_DLL whose delay is fixed. The falling clock driver 210B outputs a clock signal, which is inputted from the duty cycle correction circuit 200, as the falling clock signal FCLK_DLL of which the delay is fixed. The semiconductor memory device outputs the data to the external circuit based on the transition timing of the delay-locked rising and falling clock signals RCLK_DLL and FCLK_DLL.

The semiconductor memory device according to the preferred embodiment of the present invention is also characterized in that the clock signals outputted from the first and second DLL circuits 180A and 180B are inputted directly to the circuits to make the feedback clock signal, i.e., the first and second replica models 160A and 160B.

Occasionally, the phase of the clock signals outputted from the first and second DLL circuits 180A and 180B, which deviates from the operating range of the duty cycle correction circuit, can be inputted into the duty cycle correction circuit 20. In this case, since the duty cycle correction circuit 20 does not operate properly, the distorted feedback clock signal can be inputted into the DLL circuit if the output signal of the duty cycle correction circuit 20 is outputted to a circuit to make the feedback clock signal, i.e., the replica models. To prevent this problem, in the semiconductor memory device according to the present invention, the clock signals outputted from the first and second DLL circuits 180A and 180B are inputted, without passing through the duty cycle correction circuit 20, directly to the circuits which make the feedback signals, i.e., the first and second replica models 160A and 160B, respectively.

Figure 3:
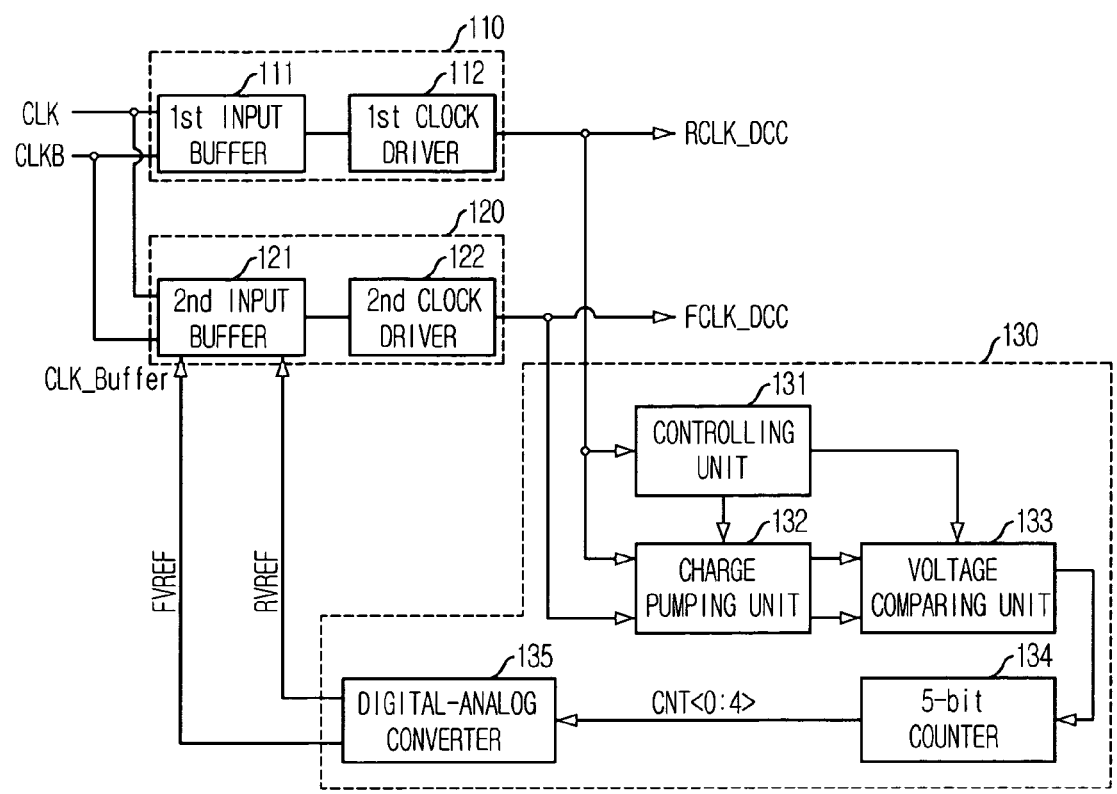
FIG. 3 is a block diagram illustrating clock buffers and an analog duty cycle correction circuit shown in FIG. 2.

FIG. 3 is a block diagram illustrating the first and second clock buffers 110 and 120 and the analog duty cycle correction circuit 130 shown in FIG. 2. The analog duty cycle correction circuit 130 includes a controlling unit 131, a charge pumping unit 132, a voltage comparing unit 133, a 5-bit counter 134 and a digital-analog converter 135. The controlling unit 131 controls the charge pumping unit 132 and the voltage comparing unit 133. The charge pumping unit 132 pumps the electric charges during the section in which the first internal clock signal RCLK_DCC outputted from the first clock buffer 110 and the second internal clock signal FCLK_DCC outputted from the second clock buffer 120 respectively maintain one logic level (high or low level). The voltage comparing unit 133 compares the levels of voltages based on an amount of the pumped electric charges in the charge pumping unit 132. The counter 134 outputs a counting value corresponding to the comparison result of the voltage comparing unit 133. The digital-analog converter 135 outputs the first control signal RVREF and the second control signal FVREF which respectively have the analog values corresponding to the counting value of the counter 134.

Moreover, as shown in FIG. 3, the first clock buffer 110 includes a first input buffer 111 and a first clock driver 112 and the second clock buffer 120 also includes a second input buffer 121 and a second clock driver 122.

Figure 4:
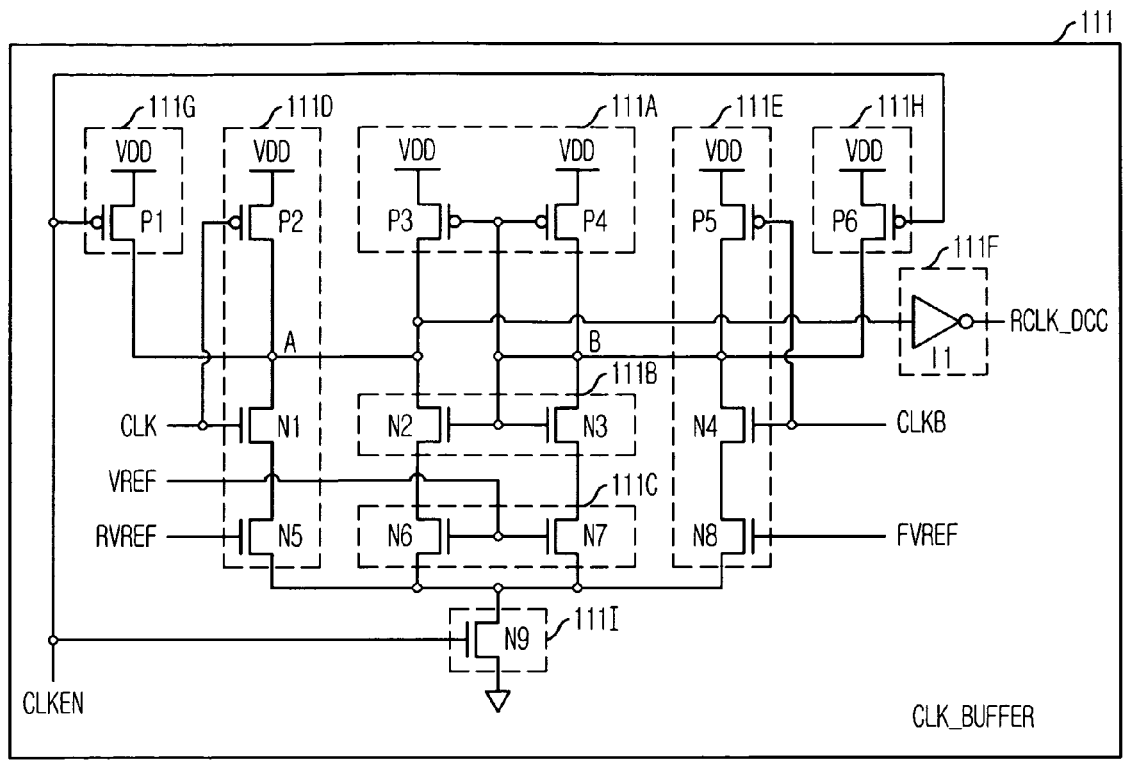
FIG. 4 is a circuit diagram illustrating an input buffer shown in FIG. 3.

FIG. 4 is a circuit diagram illustrating the first input buffer 111 shown in FIG. 3. The first input buffer 111 includes a first current mirror 111a for providing constant first and second currents for node A and node B respectively, a second current mirror 111b for making the first and second currents from the first current mirror 111a flowing through the node A and node B, a third current mirror 111c for making the first and second currents flowing from the second current mirror 111b in response to a reference signal VREF, a first input buffer unit 111d for buffering the system clock signal CLK in response to the first control signal RVREF from the analog duty cycle correction circuit 130 and for delivering the buffered system clock signal to the node A, a second input buffer unit 111e for buffering the inverted system clock signal CLKB in response to the second control signal FVREF from the analog duty cycle correction circuit 130 and for delivering the buffered signal of the inverted system clock signal to the node B, and a logic circuit 111f for receiving a voltage signal loaded on node A and for outputting the first internal clock signal RCLK_DCC as a corresponding logic value.

Also, the first input buffer 111 further includes a first switching unit 111g to provide a precharge voltage for the node A in response to an enable signal CLKEN, a second switching unit 111h to provide the precharge voltage for the node B in response to the enable signal CLKEN, and a third switching unit 111i for discharging the first and second currents which is provided by the third current mirror 111c in response to the enable signal CLKEN. The first input buffer 111 provided in the first clock buffer 110 has the same configuration as the second input buffer 121 and the first and second control signals RVREF and FVREF and the system clock signals CLK and CLKB which are inputted into the first input buffer 111 are out of phase with those which are inputted into the second input buffer 121.

Figure 5:
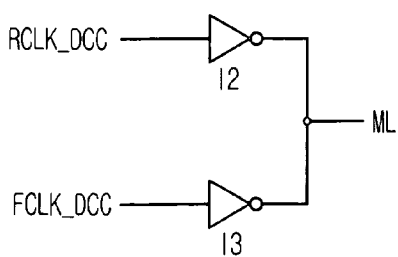
FIG. 5 is a circuit diagram illustrating a mixing circuit shown in FIG. 2.

FIG. 5 is a circuit diagram illustrating the mixing circuit 140 shown in FIG. 2. The mixing circuit 140 includes a first inverter I2 for inverting the first internal clock signal RCLK_DCC, and a second inverter I3 for inverting the second internal clock signal FCLK DCC. The output terminal of the second inverter I3 and the first inverter I2 are characterized in that they are connected to a common node.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   an input circuit configured to receive a system clock signal to generate a duty cycle-corrected clock signal by correcting a duty cycle ratio of the system clock signal;
   a delay locked loop (DLL) circuit configured to receive the duty cycle-corrected clock signal, and output first and second delay-locked clock signals, respectively produced by delay locking operations based on a rising edge and a falling edge of the duty cycle-corrected clock signal, by comparing a phase of the duty cycle-corrected clock signal with phases of first and second feedback clock signals;
   a replica model configured to receive the first and second delay-locked clock signals, and output the first and second feedback clock signals, respectively, by delaying the first and second delay-locked clock signals by a modeling delay value of the semiconductor memory device; and
   a duty cycle correction circuit configured to receive first and second delay-locked clock signals, and control the duty cycle ratio of the first and second delay-locked feedback clock signals,
   wherein the first and second delay-locked clock signals are received by the replica model prior to being duty cycle-corrected by the duty cycle correction circuit.

2. The semiconductor memory device recited in claim 1, further comprising:
   a detecting unit configured to activate a detecting signal when a section between rising and falling edges of the duty cycle-corrected clock signal is smaller than a stored value; and
   a divider configured to divide the first and second delay-locked clock signals received from the DLL circuit in response to the detecting signal and to output the divided signal to the replica model,
   wherein the frequency of the feedback clock signal is decreased by dividing the delay-locked clock signals when the frequency of the duty cycle-corrected clock signal is higher than a predetermined value.

3. The semiconductor memory device recited in claim 1, wherein the input circuit includes:
   a first clock buffer configured to output a first internal clock signal by buffering the system clock signal in response to an inverted system clock signal and to correct a duty cycle ratio of the first internal clock signal in response to a control signal;
   a second clock buffer configured to output a second internal clock signal by buffering the inverted system clock signal in response to the system clock signal and to correct a duty cycle ratio of the second internal clock signal in response to the control signal;
   an analog duty cycle correction circuit configured to output the control signal corresponding to the duty cycle ratio of the first and second internal clock signals; and
   a mixing circuit configured to mix the first and second internal clock signals and to output the duty cycle-corrected clock signal whose duty cycle is corrected.

4. The semiconductor memory device recited in claim 3, wherein the first clock buffer includes:

a first current mirror configured to provide first and second currents for first and second nodes, respectively;

a second current mirror configured to make the first and second currents flow from the first current mirror through the first and second nodes;

a third current mirror configured to make the first and second currents flow from the second current mirror in response to a reference signal;

a first input buffer unit configured to buffer the system clock signal in response to a first control signal from the analog duty cycle correction circuit and configured to deliver a buffered system clock signal to the first node;

a second input buffer unit configured to buffer the inverted system clock signal in response to a second control signal from the analog duty cycle correction circuit and configured to deliver a buffered signal of the inverted system clock signal to the second node; and a logic circuit configured to receive a voltage signal loaded on the first node and configured to output the first internal clock signal as a corresponding logic value.

5. The semiconductor memory device recited in claim 4, wherein the second clock buffer includes:

a fourth current mirror configured to provide third and fourth currents for third and fourth nodes, respectively;

a fifth current mirror configured to make the third and fourth currents flow from the fourth current mirror through the third and fourth nodes;

a sixth current mirror configured to make the third and fourth currents flow from the fifth current mirror in response to the reference signal;

a third input buffer unit configured to buffer the inverted system clock signal in response to the second control signal from the analog duty cycle correction circuit and configured to deliver a buffered signal of the inverted system clock signal to the third node;

a fourth input buffer unit configured to buffer the system clock signal in response to the first control signal from the analog duty cycle correction circuit and configured to deliver a buffered system clock signal to the fourth node; and a logic circuit configured to receive a voltage signal loaded on the third node and configured to output the second internal clock signal as a corresponding logic value.

6. The semiconductor memory device recited in claim 5, wherein the first clock buffer further includes:

a first switching unit configured to provide a precharge voltage for the first node in response to an enable signal;

a second switching unit configured to provide the precharge voltage for the second node in response to the enable signal; and a third switching unit configured to discharge the first and second currents which is provided by the third current mirror in response to the enable signal.

7. The semiconductor memory device recited in claim 6, wherein the second clock buffer further includes:

a fourth switching unit configured to provide the precharge voltage for the third node in response to the enable signal;

a fifth switching unit configured to provide the precharge voltage for the fourth node in response to the enable signal; and a sixth switching unit configured to discharge the third and fourth currents which is provided by the sixth current mirror in response to the enable signal.

8. The semiconductor memory device recited in claim 5, wherein the analog duty cycle correction circuit includes:

a charge pumping unit configured to pump electric charges during a section in which the first internal clock signal outputted from the first clock buffer and the second internal clock signal outputted from the second clock buffer respectively maintain one logic level;

a voltage comparing unit configured to compare voltage levels based on an amount of the electric charges pumped by the charge pumping unit;

a counter configured to output a counting value corresponding to a comparison result of the voltage comparing unit; and a digital-analog converter configured to output the first control signal and the second control signal each of which has an analog value corresponding to the counting value counted in the counter.

9. The semiconductor memory device recited in claim 3, wherein the mixing circuit includes:

a first inverter configured to invert the first internal clock signal; and a second inverter configured to invert the second internal clock, wherein output terminals of the first and second inverters are connected to a common terminal.

10. The semiconductor memory device recited in claim 1, wherein the DLL circuit includes:

a first DLL circuit configured to perform the delay locking operation based on the rising edge of the duty cycle-corrected clock signal; and a second DLL circuit configured to perform the delay locking operation based on the falling edge of the duty cycle-corrected clock signal.

* * * * *